United States Patent [19]
Sueoka et al.

[11] Patent Number: 5,384,733
[45] Date of Patent: Jan. 24, 1995

[54] SEMICONDUCTOR MEMORY DEVICE

[75] Inventors: Atsushi Sueoka; Hiroyuki Koinuma, both of Yokohama, Japan

[73] Assignee: Kabushiki Kaisha Toshiba, Kanagawa, Japan

[21] Appl. No.: 73,509

[22] Filed: Jun. 9, 1993

[30] Foreign Application Priority Data

Jul. 23, 1992 [JP] Japan .................. 4-197207

[51] Int. Cl.$^6$ .............................. G11C 7/00
[52] U.S. Cl. ................. 365/189.01; 365/191; 365/230.03
[58] Field of Search ...................... 365/189.01, 230.03, 365/191

[56] References Cited

U.S. PATENT DOCUMENTS

| | | | |
|---|---|---|---|
| 4,763,303 | 8/1988 | Flannagan | 365/189.01 |
| 4,866,675 | 9/1989 | Kawashima | 365/194 |
| 4,899,316 | 2/1990 | Nagami | 365/189.01 |
| 5,136,546 | 8/1992 | Fukuda et al. | 365/230.03 |
| 5,268,863 | 12/1993 | Bader et al. | 365/189.01 |

Primary Examiner—Eugene R. LaRoche
Assistant Examiner—Son Dinh
Attorney, Agent, or Firm—Finnegan, Henderson, Farabow, Garrett & Dunner

[57] ABSTRACT

A semiconductor memory device having a plurality of bits includes an input buffer for receiving external data, a first write circuit for inputting a first control signal, and an output of the input buffer, and outputting the result on a first data line. A second write circuit inputs a second control signal and the result from the first data line, and outputs another output on a second data line. In a data writing operation, the second control signal is used commonly for at least two bits. The first write circuit sets the first data line to a fixed potential state when the first control signal is effective. In response to the fixed potential status on the first data line, the second write circuit sets the second data line to a potential state in which the second control signal is disregarded. A write per bit mode operation is controlled by controlling the second write circuit through a first data line. A control signal for controlling the write circuits can be used commonly for a plurality of bits, so that the number of control signals for controlling the write circuits can be reduced and thereby a pattern area required for wiring can be reduced.

5 Claims, 13 Drawing Sheets

*WHEN DATA AT In IS HIGH (NON-MASKED BIT)

*WHEN DATA AT In IS HIGH (MASKED BIT)

*WHEN DATA AT In IS HIGH (NON-MASKED BIT)

*WHEN DATA AT In IS HIGH (MASKED BIT)

5,384,733

SEMICONDUCTOR MEMORY DEVICE

BACKGROUND OF THE INVENTION

The present invention relates to a semiconductor memory device, and more specifically to a DRAM (Dynamic Random Access Memory).

The DRAM is provided with a write circuit for writing data in a memory cell. Recently, DRAMs with multi-bit construction have been widely used, which are capable of write per bit mode operation. In this type of DRAM, the data writing operation must be controlled in bit units, and a problem arises in that the number of control signals increases and the pattern area becomes larger.

SUMMARY OF THE INVENTION

Accordingly, the object of the present invention is to provide a semiconductor memory device of multi-bit construction in which a number of control signals is small and a pattern area necessary for wiring is small.

According to the present invention, the write per bit mode operation is controlled by a first data line that controls a second write circuit. Since the writing operation is controlled for each bit, it is unnecessary to use an independent control signal for each bit. Hence the number of control signals for controlling the write circuits can be reduced and thereby a pattern area required for wiring can be reduced considerably.

DETAILED DESCRIPTION OF THE PREFERRED EMBODIMENTS

Figure 1:
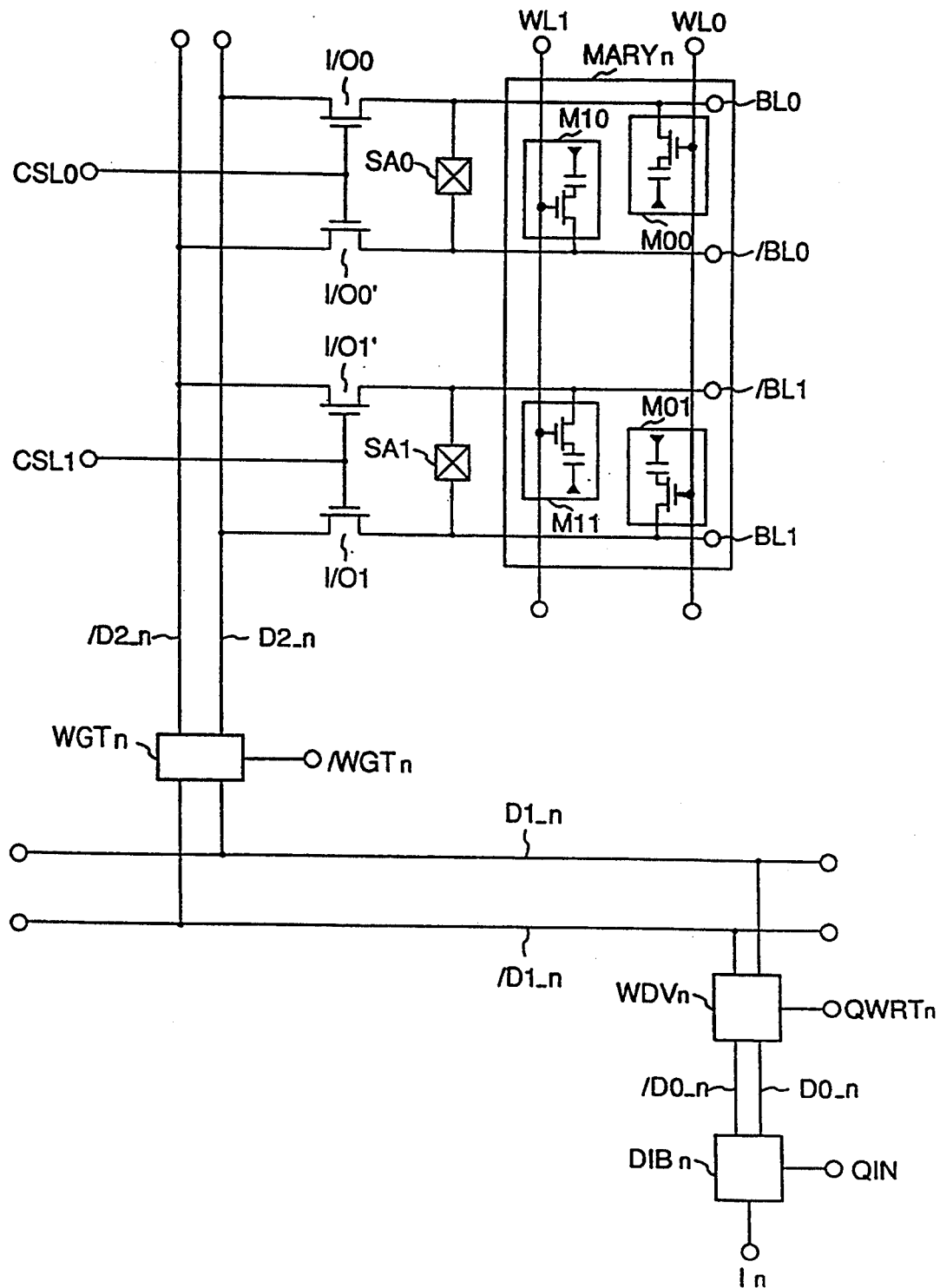
FIG. 1 is a block diagram showing a circuit required for writing a data for one bit of a first embodiment of the semiconductor memory device according to the present invention.

The first embodiment of the present invention will be described with reference to the attached drawings.

A write circuit configuration of the DRAM of the first embodiment will be described with reference to FIG. 1. In a memory cell array MARYn shown in FIG. 1, four memory cells M00, M10, M01, and M11 are arranged in a matrix fashion. The memory cells M00 and M01 are connected to a word line WL0, and the memory cells M10 and M11 are connected to a word line WL1.

Memory cell M00 is connected to a bit line BL0, the memory cell M10 is connected to a bit line /BL0, the memory cell M01 is connected to a bit line BL1, and the memory cell M11 is connected to a bit line /BL1, respectively.

Sense amplifiers are connected between pairs of the bit lines, respectively. That is, a sense amplifier SA0 is connected between the pair of bit lines BL0 and /BL0, and a sense amplifier SA1 is connected between the pair of bit lines BL1 and /BL1.

The bit lines are connected to second data lines through column gate transistors, respectively. In particular the bit line BL0 and the second data line D2n are connected to a source and a drain of the column gate transistor I/O0; the bit line /BL0 and the second data line /D2n are connected to a source and a drain of the column gate transistor I/O0'; the bit line /BL1 and the second data line /D2n are connected to a source and a drain of the column gate transistor I/O1'; and the bit line BL1 and the second data line D2n are connected to a source and a drain of the column gate transistor I/O1, respectively. Further, the gates of the column gate transistors I/O0 and I/O0' are connected in common to a column select line CSL0, and the gates of the column gate transistors I/O1' and I/O1 are connected in common to a column select line CSL1.

A write gate WGn is connected between a pair of first data lines D1n and /D1n and a pair of the second data lines D2n and /D2n, and activated only when a control signal /WGTn is at a low level, to transmit a data from the pair of the first data lines D1n and /D1n to the pair of the second data lines D2n and /D2n.

A write driver WDVn drives the pair of the first data lines D1n and /D1n in response to outputs D0n and /D0n of an input buffer DIBn. The write driver WDVn is activated when a control signal QWRTn is at high level.

The input buffer DIBn is activated when a control signal QIN is at high level to receive external data into the semiconductor memory device through an input terminal In and transmit the received data to the write driver WDVn as the outputs D0n and /D0n.

In the above-mentioned circuit configuration, the bit lines BL and /BL, the second data lines D2n and /D2n, and the first data lines D1n and /D1n are paired, respectively, so that the data through the input terminal In can be transmitted complementarily. In other words, when high-level data is inputted through the input terminal In, the first data line D1n is at high level; the first data line /D1n is at low level; the second data line D2n is at high level; the second data line /D2n is at low level; the bit line BL is at high level; and the bit line /BL is at low level, in order to transmit data at mutually opposite polarity (level).

Here, the transmission route of the data from the input terminal In to the memory cell will be described. In the following description, it is assumed that the word line WL0 and the column select line CSL0 are both at high level and the memory cell M00 is selected from among the four memory cells.

First, the control signal QIN is changed to high level to activate the input buffer DIBn, so that data is received through the input terminal In as outputs D0n and /D0n. Sequentially, the control signal QWRTn is changed to high level to activate the write driver WDVn, so that the first data lines are driven on the basis of the outputs of the input buffer DIBn. Thereafter, the control signal /WGTn is changed to low level to open the write gate WGTn, so that the data on a pair of the first lines D1n and /D1n is transmitted to a pair of the second data lines D2n and /D2n. The data on the pair of second data lines D2n and /D2n is transmitted to the pair of bit lines BL0 and /BL0 through the column gate transistors I/O0 and I/O0' (because the column select line CSL0 is at high level), and the data is transmitted from the bit line BL0 to the destination memory cell M00.

Figure 2:
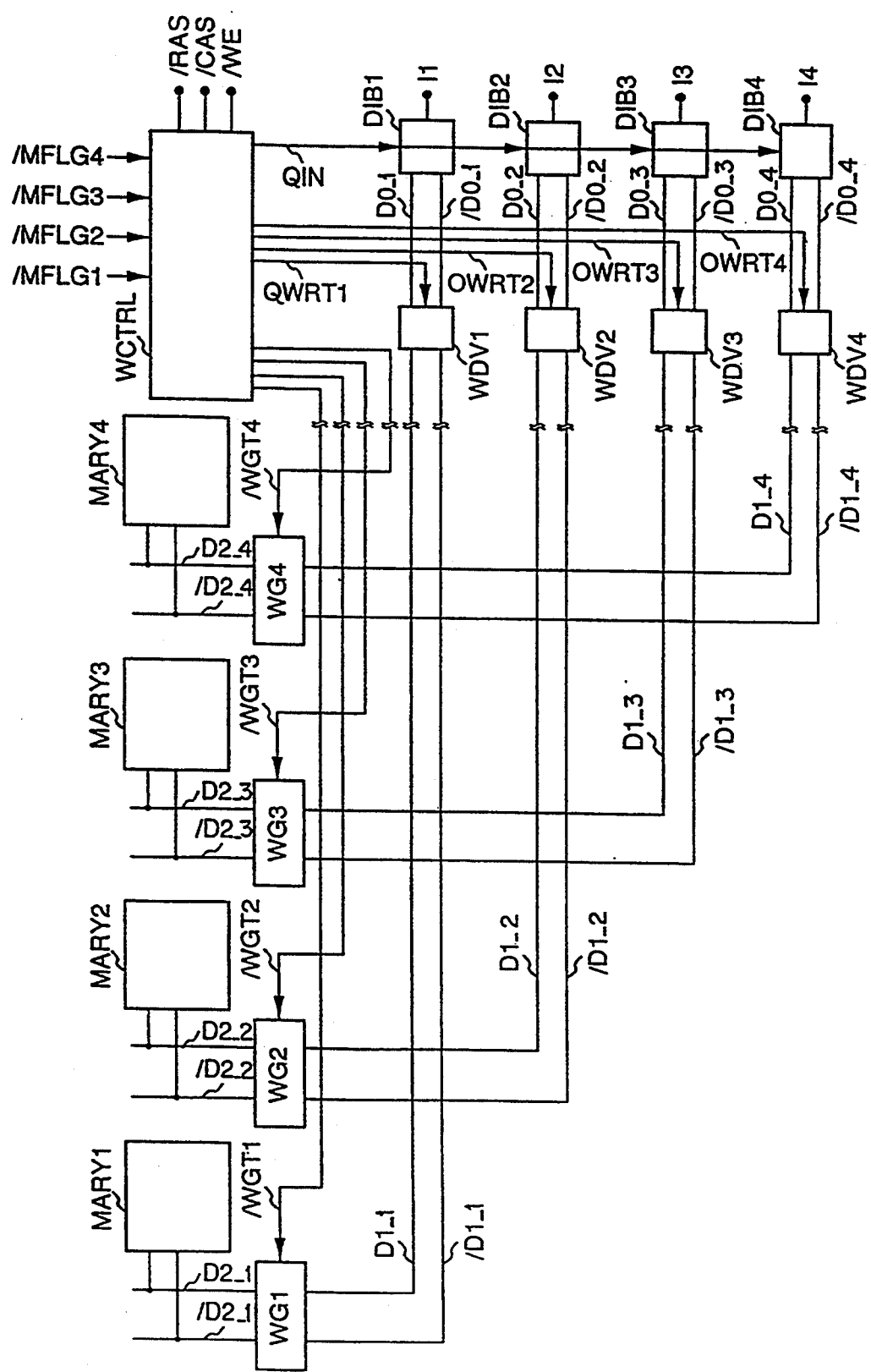
FIG. 2 is a block diagram showing a circuit configuration provided with circuits (each shown in FIG. 1) for writing data for four bits.

The semiconductor memory device includes a device in which the number of data bits ("bit" and "input terminal" are both used in the same sense, hereinafter) writable or readable in response to a single address designation is plural (i.e., 4, 8 or 16, respectively). FIG. 2 shows a semiconductor memory device of 4 bit construction by way of an example.

The device shown in FIG. 2 includes four circuits, each shown in FIG. 1, and a control circuit WCTRL. This control circuit WCTRL inputs a row address strobe signal /RAS, a column address strobe signal /CAS, a write enable signal /WE, and control signals /MFLG1 to /MFLG4, which correspond to irregular operation signals, and outputs control signals WGT1 to WGT4, QWRT1 to QWRT4, and QIN.

In the semiconductor memory device of multi-bit constitution, since a plurality of input terminals In (n=1, 2, 3, 4) are provided, a peculiar operation (referred to as write per bit) is often performed such that in a write cycle it is possible to select any n-th input terminal (through which data is written to a memory cell) from among a plurality of input terminals. In the case of the ordinary write cycle operation, if the number of the input terminals I1 to I4 is four, all the data are written through all the input terminals. In the case of the write per bit operation, however, it is possible to select data of the input terminals, for instance, such that data are written through input terminals I2 and I3, but not written through input terminals I1 and I4.

Figure 3:
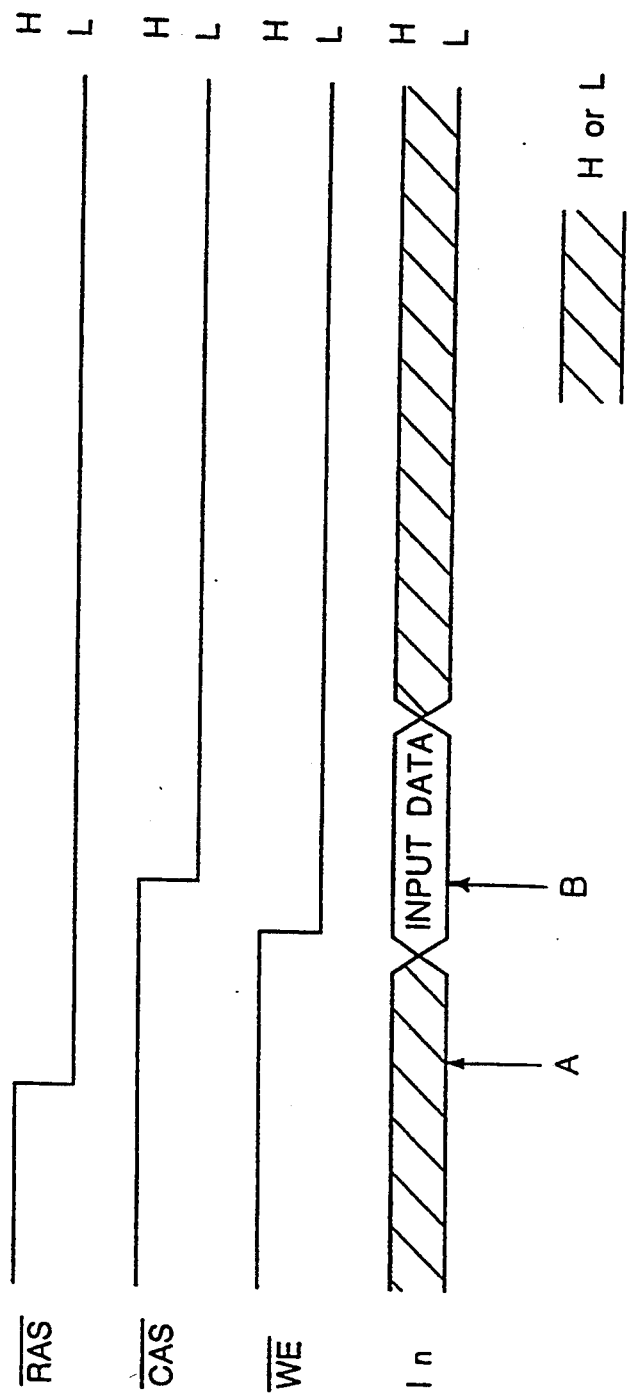
FIG. 3 is a timing diagram showing waveforms of respective signals in a write cycle in the first embodiment of the semiconductor memory device according to the present invention.

The above-mentioned write per bit operation will be described in more detail hereinbelow. FIG. 3 is a timing diagram for assistance in explaining the ordinary writing operation. As shown in FIG.3, when the row address strobe signal /RAS changes from high to low level at a time point indicated by an arrow A, the write enable signal /WE is at high level. In the case of the ordinary writing operation, all the data on all the input terminals are written in the memory cells when the column address strobe signal/CAS changes to low level (cf. FIG. 3, arrow B).

Figure 4:
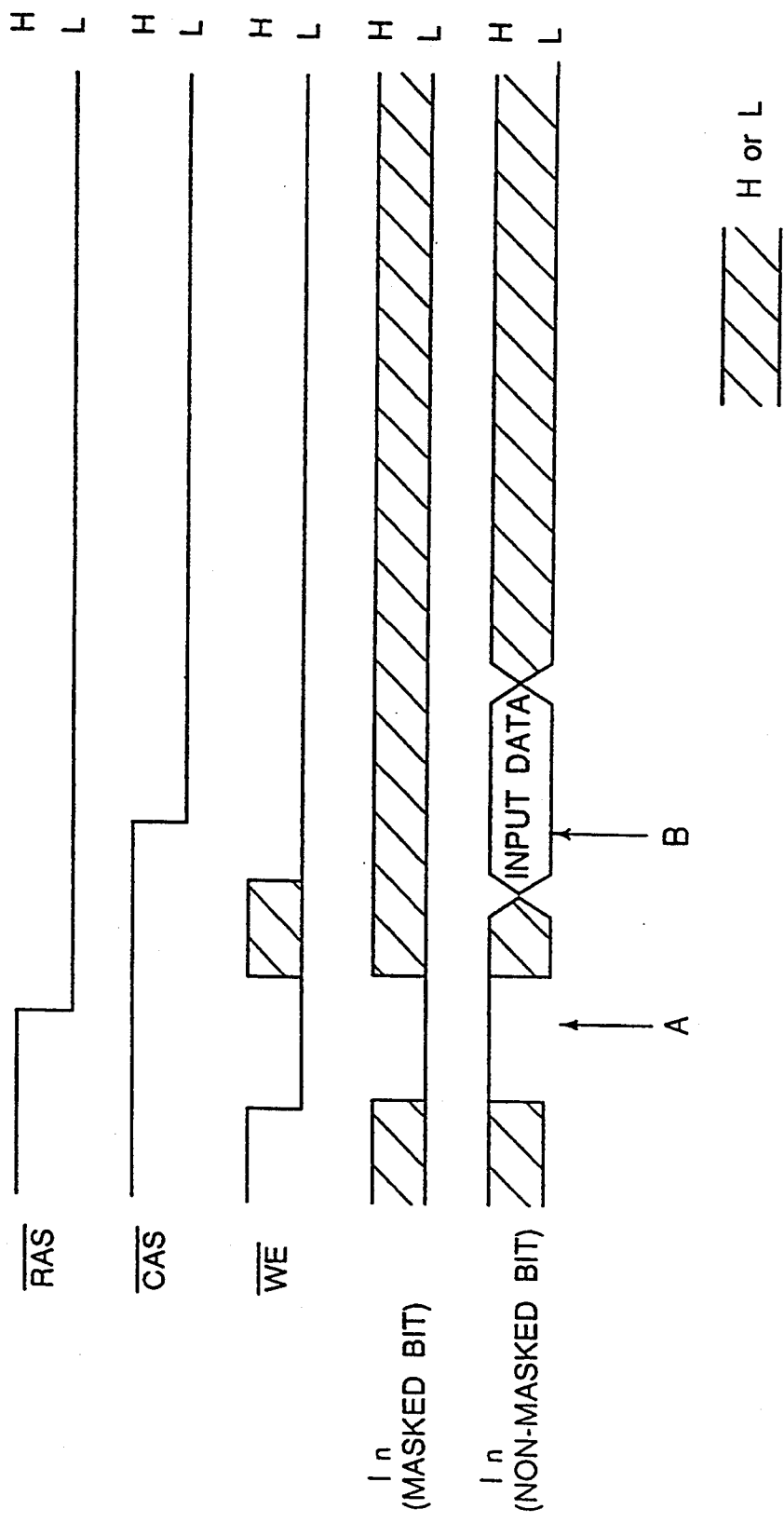
FIG. 4 is a timing diagram showing waveforms of respective signals in the write per bit mode in the semiconductor memory device.

In contrast, FIG. 4 is a timing diagram for assistance in explaining the write per bit operation. When the row address strobe signal /RAS drops from high to low level, the write enable signal /WE is at low level. In the case of the write per bit operation, at the time point indicated by arrow A, it is decided whether the data are written through the respective input terminals when the column address strobe signal /CAS drops to low level (cf. FIG. 4, arrow B), on the basis of the polarity of the data on the respective input terminals. In other words, at the time point indicated by arrow A, the high level input terminals are non-masked bits, so that the data on these input terminals are written when the column address strobe signal /CAS drops to low level (cf. FIG. 4, arrow B). In contrast, the low level input terminals are masked bits, so that the data on these input terminals are not written.

At the time point indicated by arrow A, the information which exists at each input terminal as to whether the data is to be written or not is already input into the chip. Furthermore, this information is affected by the polarity of the control signals /MFLG1 to /MFLG4. Let us suppose that the polarity of the signals is low in the masked bits and high in the nonmasked bits. In addition, the polarity is retained until the row address strobe signal /RAS changes to high again.

The practical configurations of the write gate WGn, the write driver WDVn and the control circuit WCTRL shown in FIG. 2 will be described hereinbelow.

Figure 5:
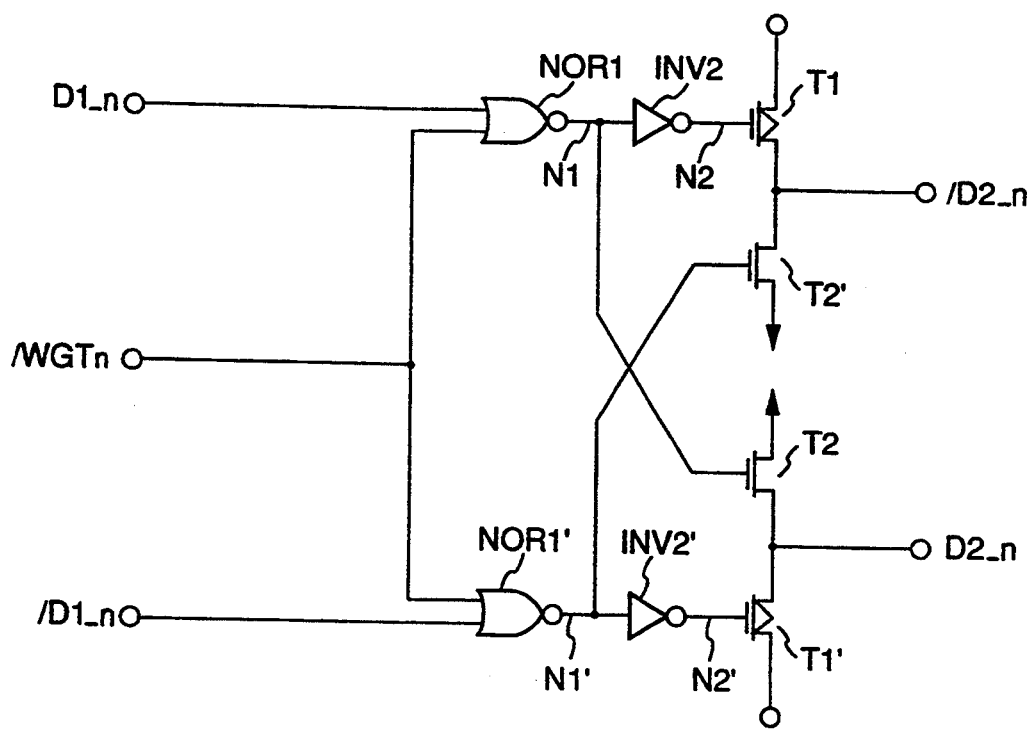
FIG. 5 is a circuit diagram showing a write gate of the semiconductor memory device.

FIG. 5 shows the configuration of the write gate WGn. As described above, the write gate WGn receives the data D1n and /D1n outputs from the write driver WDVn and the control signal /WGTn output from the control circuit WCTRL, and transmits the data to a pair of the second data lines D2n and /D2n.

First, at the stage before the write cycle, the control signal /WGTn is at high level and the potential at a node N1 of an output terminal of the NOR gate NOR1 is at low level, so that an N-channel transistor T2 whose gate is connected to node N1 is turned off. Further, the potential at node N1 is inverted by an inverter INV2, so that a node N2 of an output terminal of the inverter INV2 is at high level. Accordingly, a P-channel transistor T1 whose gate is connected to node N2 is also turned off. In the same way, the potential at a node N1' of an output terminal of a NOR gate NOR1' is also at low level. The potential at a node N2' is inverted by an inverter INV2', so that the node N2' is also at high level. Accordingly, an N channel transistor T2' whose gate is connected to the node N1' and the P-channel transistor T1' whose gate is connected to the node N2' are both turned off. As a result, the write gate WGn is in a high impedance state, so that a pair of the first data lines D1n and /D1n and a pair of the second data lines D2n and /D2n are disconnected from each other (shut off between both data line pairs).

In the write cycle, the control signal /WGTn changes to low level, so that the outputs of the NOR gates NOR1 and NOR1' are determined by the levels of a pair of the first data lines D1n and /D1n. That is, if the data line D1n is at high level (the data line /D1n is at low level), the output of the NOR gate NOR1 is at low level and the output of the NOR gate NOR1' is at high level. Accordingly, the P-channel transistor T1 and the N-channel transistor T2 are both turned off; and the N-channel transistor T2' and the P-channel transistor T1' are both turned on. As a result, the potential of the second data line /D2n is at low level and the potential of the second data line D2n is at high level.

Conversely, if the data line D1n is at the low level (the date line /D1n is at high level), a low-level data is output to the second data line D2n, and high-level data is output to the second data line /D2n.

Figure 6:
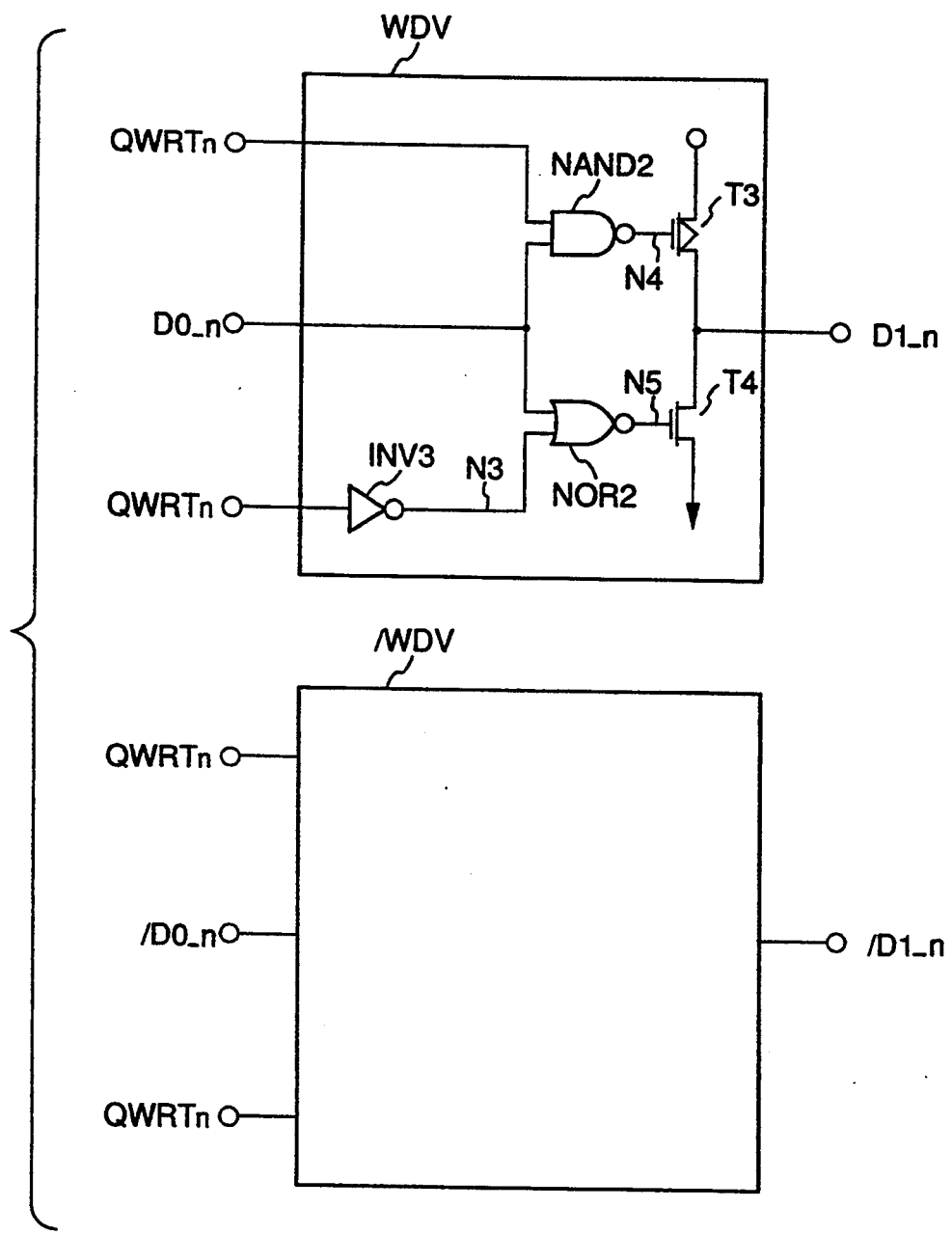
FIG. 6 is a circuit diagram showing a write driver of the semiconductor memory device.

FIG. 6 shows the configuration of the write driver WDVn. The write driver WDVn is composed of a write driver WDV having the first data line D1n as an output and another write driver /WDV having the first data line /D1n as an output. The write driver WDV receives the control signal QWRTn from the control circuit WCTRL and the data D0n output from the input buffer DIBn. The write driver /WDV receives the control signal QWRTn from the control circuit WCTRL and the data /D0n output from the input buffer DIBn.

Here, since the circuit configuration of the write driver WDV is the same as that of the write driver /WDV, only the write driver WDV will be described.

At the stage before the write cycle, the control signal QWRTn is at low level, so that a node N4 of an output terminal of a NAND gate NAND2 is at high level. Accordingly, a P-channel transistor T3 whose gate is connected to the node N4 is turned off. Further, the control signal QWRTn is inverted by an inverter INV3 and thereby the potential at a node N3 of an output terminal of the inverter INV3 is at high level. Accordingly, a node N5 of an output terminal of a NOR gate NOR2 is at low level, so that an N-channel transistor T4 whose gate is connected to the node N5 is turned off. As described above, when the control signal QWRTn is at low level, the P-channel transistor T3 and the N-channel transistor T4 are both turned off. As a result of this, the write drivers WDV and/WDV are both in high impedance state, so that the input data D0n and /D0n is not transferred to a pair of the first data lines D1n and /D1n.

In the write cycle, the control signal QWRTn changes to high level. In this case, the outputs of the NAND gate NAND2 and NOR gate NOR2 are determined by the polarity of the data D0n. For instance, if the data D0n is at high level, the node N4 of the output terminal of the NAND gate NAND2 is at low level, and the node N5 of the output terminal of the NOR gate NOR2 is also at low level. Accordingly, only the P-channel transistor T3 is turned on, so that the high-level data is outputted to the first data line D1n. In contrast with this, if the input data D0n is at low level, only the N-channel transistor T4 is turned on, so that the low-level data is output to the first data line D1n. As described above, when the control signal QWRTn is at high level, data of the same polarity as the input data D0n is output.

The write driver /WDV operates in the same way in response to the data /D0n which is opposite in polarity to the data D0n inputted to the write driver WDV. That is, the write driver /WDV outputs the data at the same polarity as the input data /D0n to the first data line /D1n.

Figure 7:
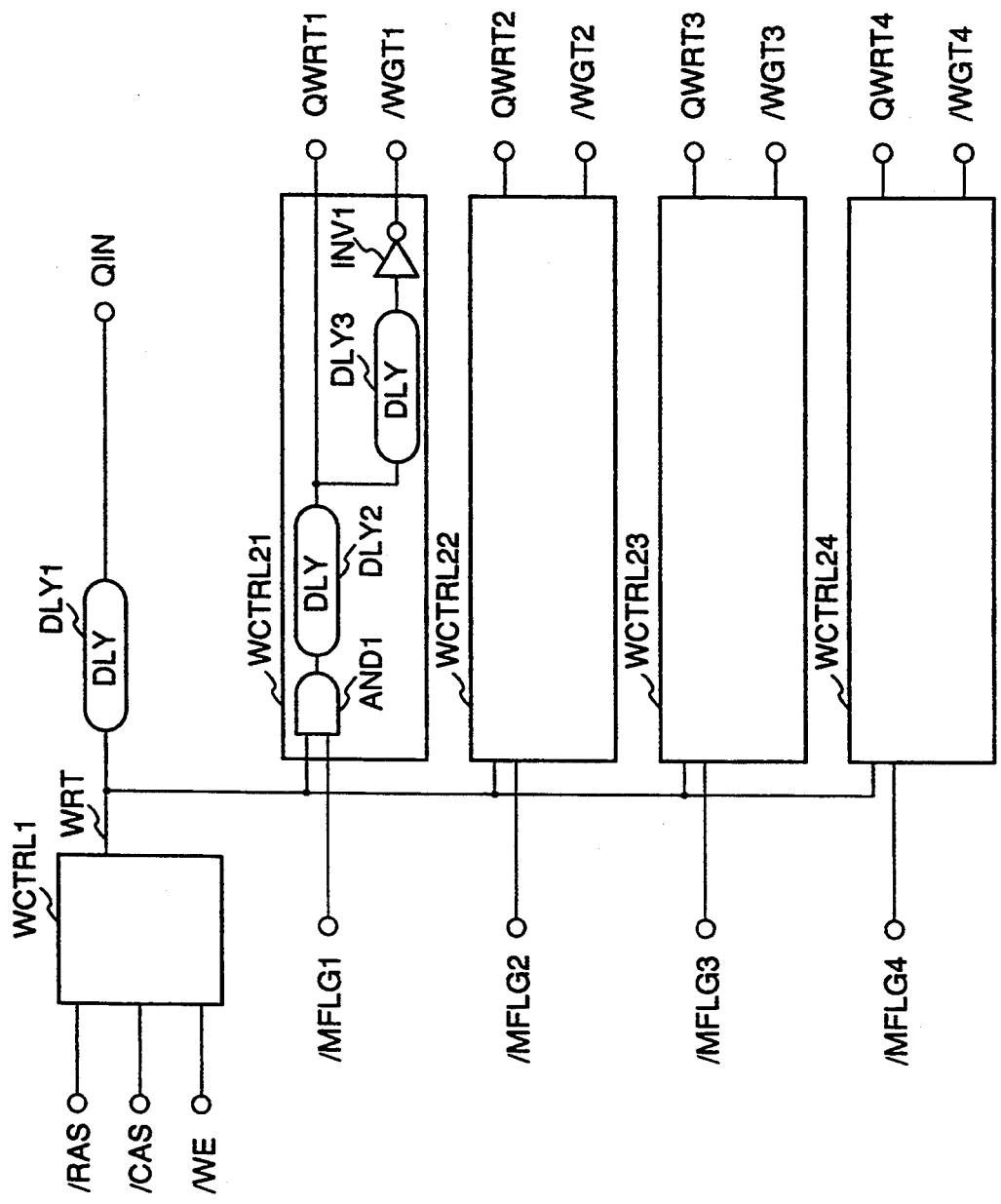
FIG. 7 is a circuit diagram showing a control circuit of the semiconductor memory device.

The circuit configuration for generating the control signal will be described hereinbelow. FIG. 7 shows the control circuit WCTRL. This circuit WCTRL controls the circuit for writing data for four bits as already described. The circuit inputs the respective signals RAS, /CAS, /WE and /MFLG1 to /MFLG4 and outputs the control signals QIN, QWRT1 to QWRT4 and /WGT1 to /WGT4.

The control circuit WCTRL is further divided into circuits WCTRL1, WCTRL21, WCTRL22, WCTRL23 and WCTRL24. The circuit WCTRL1 inputs the signals /RAS, /CAS and /WE. Upon the write cycle, when these inputted signals change to low level, this circuit WCTRL1 detects these inputted signals and outputs high level data WRT. This data WRT is delayed by a delay circuit DLY1 by a predetermined time and output as a control signal QIN to activate the DIB1 to DIB4.

Further, an output WRT of the circuit WCTRL1 is input to the circuits WCTRL21 to WCTRL24, respectively. In addition, signals /MFLG1 to /MFLG4 are input to circuits WCTRL21 to WCTRL24, respectively.

In each circuit WCTRL21 to WCTRL24, a signal WRT and a control signal /MFLGn are input to an AND gate AND1. In the write cycle, since the data WRT is at high level, when the control signal /MFLGn is at high level, the output of the AND gate AND1 becomes high level, so that the control signal QWRTn, after passing through a delay circuit DLY2 is output at high level and the control signal /WGTn, after passing through a delay circuit DLY3 and an inverter INV1 is output at low level. As a result, in response to the high level control signal QWRTn, the write driver WDVn (FIG. 6) is activated. In response to the low level control signal WGTn, the write gate WGn (FIG. 5) is opened, so that the data is written. In other words, a bit in which the high level control signal /MFLGn is input become a non-masked bit.

In contrast, when the control signal /MFLGn is at low level, since the output of the AND gate AND1 of the circuit WCTRL2n becomes low level, the control signal QWRTn is output at low level, and the control signal /WGTn is output at high level. Accordingly, at a bit in which the control signal /MFLGn is at low level, the write driver WDVn and the write gate WGn are both at high impedance. Therefore, the data input to an input terminal In of the input buffer DIBn is not transferred to the memory cell. As described above, in accordance with the mask information, the polarity of the control signals QWRTn and /WGTn of the respective bit is determined, so that it is possible to realize the data writing operation through some input terminals and the data no-writing operation through other-input terminals.

Here, the operation of the control signals and the data lines in the masked bits and the non-masked bits will be described with reference to FIGS. 8 and 9.

Figure 8:
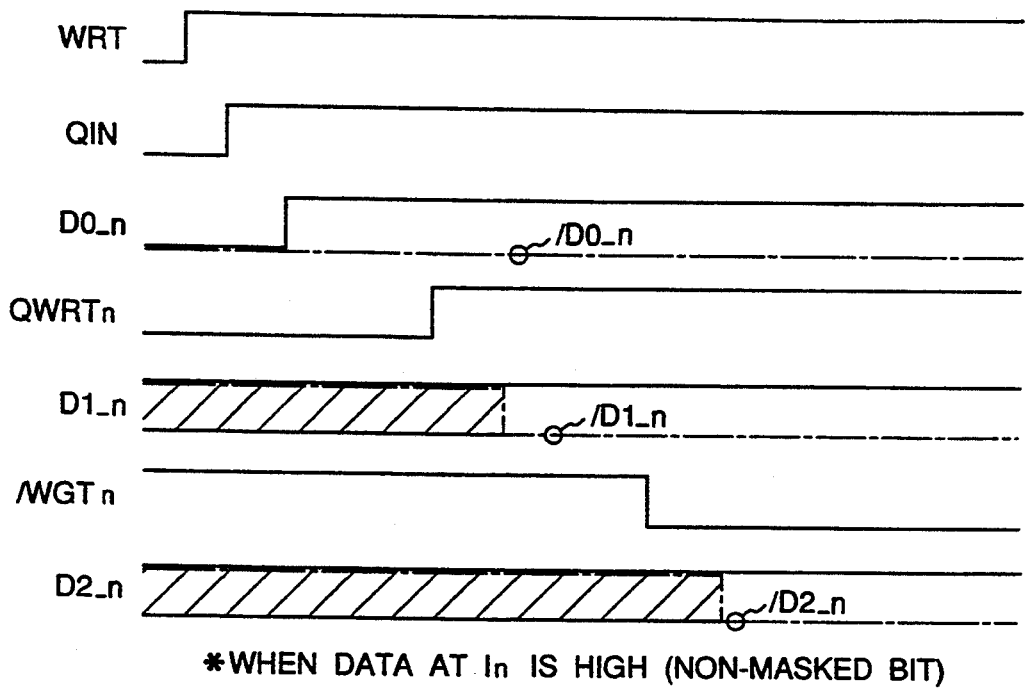
FIG. 8 is a timing diagram showing the relationship between the respective pairs of data lines and the control signals in a non-masked bit in the semiconductor memory device.

As shown in FIG. 8, upon the write cycle, the control signal WRT first changes to high level, and then QIN changes to high level (this corresponds to the status in which /RAS, /CAS and /WE are all at low level in FIG. 3). Under these conditions, the input buffer is activated to receive data at high level, for instance, through the input terminal In, so that the output D0n changes to the high level. Since the control signal /MFLGn is at high level in the non-masked bits, the control circuit WCTRL2n changes the control signal QWRTn to the high level in response to the high level control signal WRT. Therefore, the write driver WDVn is activated to drive a pair of the first data lines D1n and /D0n on the basis of the outputs D1n and /D0n of the input buffer. Further, after a predetermined delay time, the control circuit WCTRL2n changes the control signal /WGTn to the low level. Then, the write gate WGn is opened to transmit the data on a pair of the first data lines D1n and /D1n to a pair of the second lines, so that the transmitted data is stored in the memory cell, as already explained.

Figure 9:
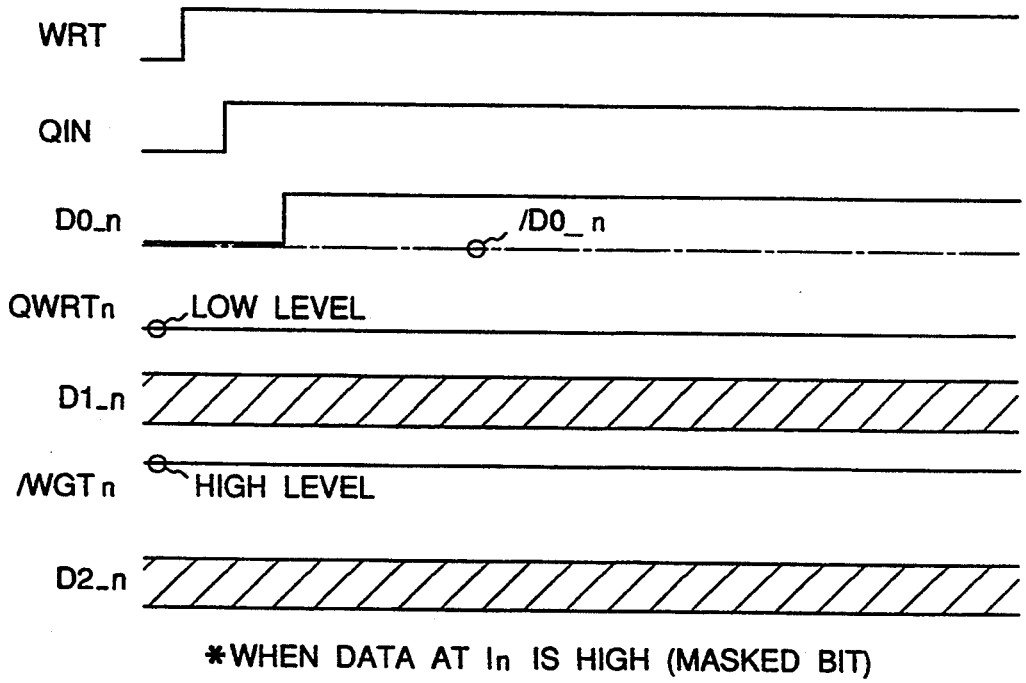
FIG. 9 is a timing diagram showing the relationship in between the respective pairs of data lines and the control signals in a masked bit in the semiconductor memory device.

FIG. 9 shows the waveform diagrams for assistance in explaining that data is not transmitted to the first and second data pairs due to a masked bit, in spite of the fact that high level data is on the input terminal In.

As shown in FIG. 9, upon the write cycle (this corresponds to the status in which /RAS, /CAS and /WE are all at low level), the control signal WRT first changes to high level, and then QIN changes to high level, irrespective of the masked bits. Under these conditions, the input buffer is activated to receive the high level data through the input terminal In, so that the output thereof changes to high level. Here, since control signal /MFLGn is at low level in the masked bit, even if the control signal WRT changes to the high level, the control circuit WCTRL2n does not change the control signal QWRTn to high level, with the result that the write driver WDVn is not activated. Therefore, a pair of the first data lines D1n and /D1n are not driven. Further, the control signal /WGTn is kept at high level, so that the write gate WGn is kept closed without transmitting the data on a pair of the first data lines D1n and /D1n to a pair of the second data lines. Over the time period shown in FIG. 9, each polarity of a pair of the first data lines D1n and /D1n and a pair of the second data lines D2n and /D2n is set on the basis of a pair of the bit lines BL and /BL read by a certain reading circuit (each pair of the data lines is of course in the complementary polarity relationship), although not so far explained herein.

As described above, in the first embodiment, in order to control whether data is written or not for each bit, the control signals QWRTn and /WGTn independent in bit unit are given to the respective write drivers WDVn and the write gates WGn. Accordingly, when the number of bits increases as 8 or 16 bits, since the control signals corresponding to the number of bits are inevitably required, the number of the control signals increases. As a result, the number of wires increases in a chip and therefore the area for the wiring pattern also increases. The second embodiment described below can reduce the wiring pattern area, as compared with the first embodiment.

Figure 10:
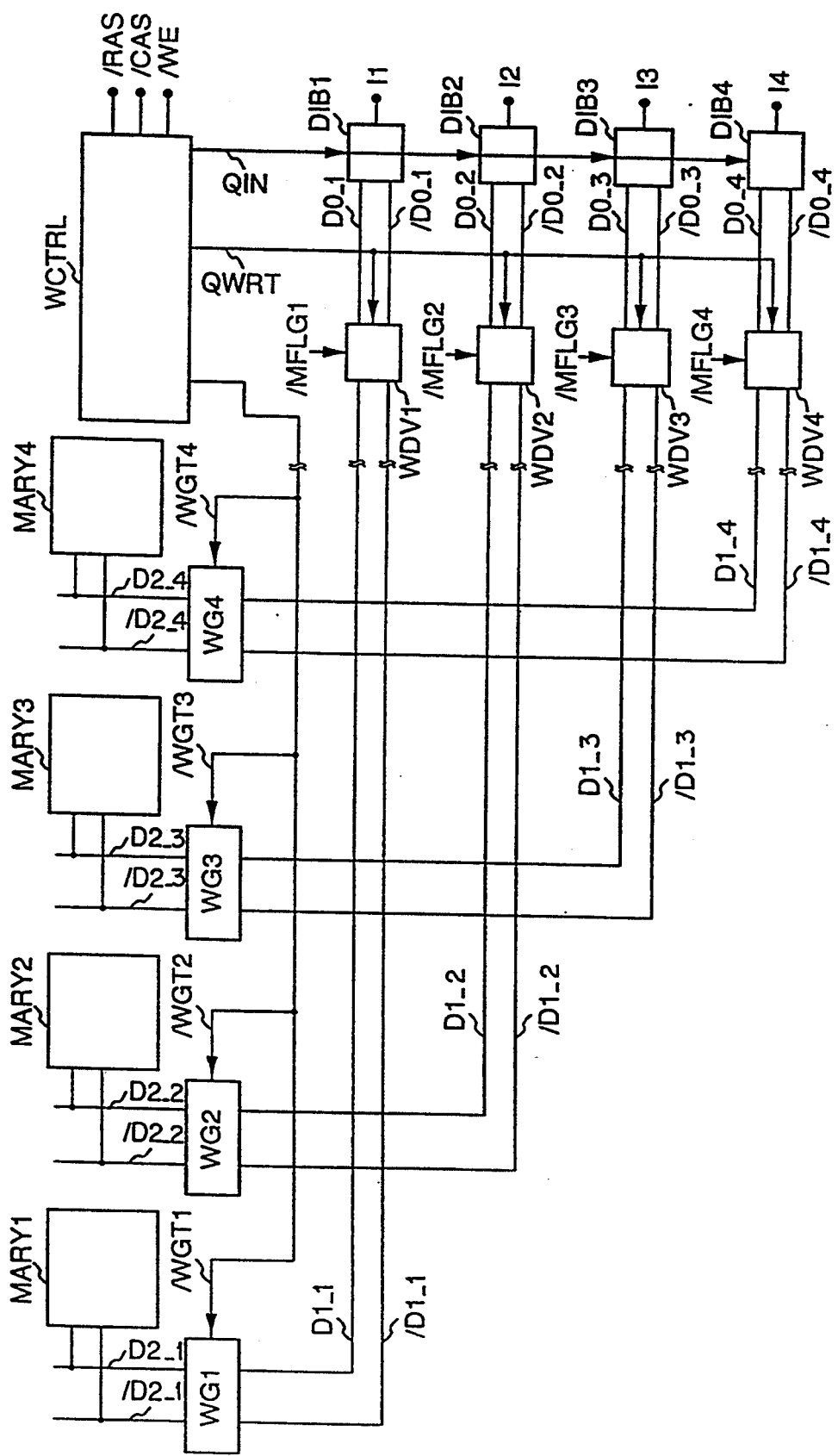
FIG. 10 is a block diagram showing a second embodiment of the semiconductor memory device according to the present invention.

FIG. 10 shows the configuration of the second embodiment of the write circuit of the semiconductor memory device of the present invention. In the case of the circuit of the first embodiment shown in FIG. 2, the control signals /WGTn for controlling the open/close operation of the write gates WG1 to WG4 and the control signals QWRTn for controlling the write drivers are required to be provided independently for each bit. In the second embodiment, only a single control signal /WGT and a single control signal QWRT are sufficient for all the bits.

Figure 11:
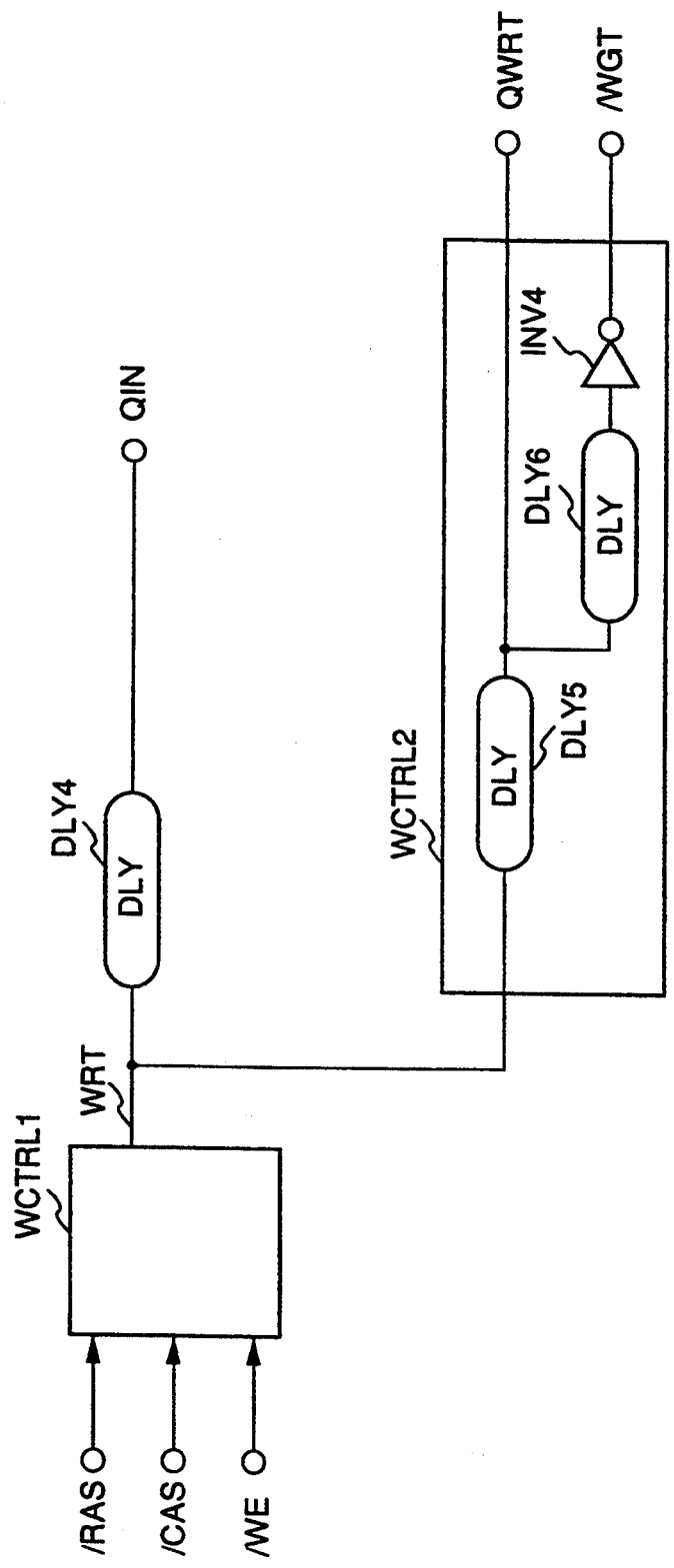
FIG. 11 is a block diagram showing a control circuit of the second embodiment of the semiconductor memory device.
Figure 12:
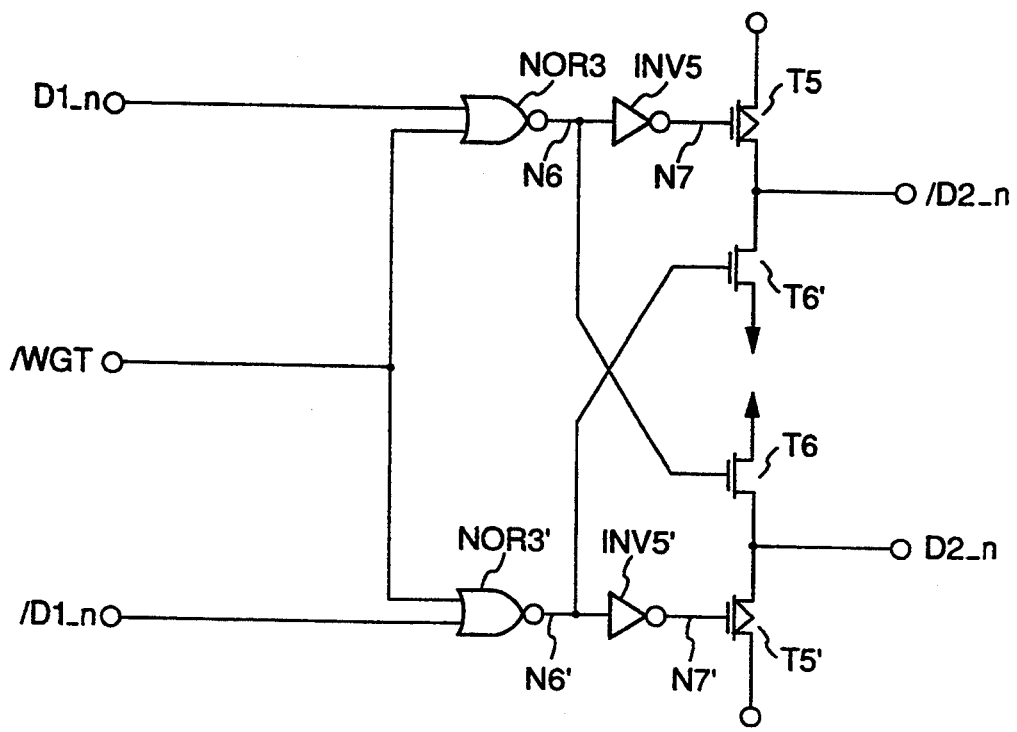
FIG. 12 is a block diagram showing a write gate of the second embodiment of the semiconductor memory device.
Figure 13:
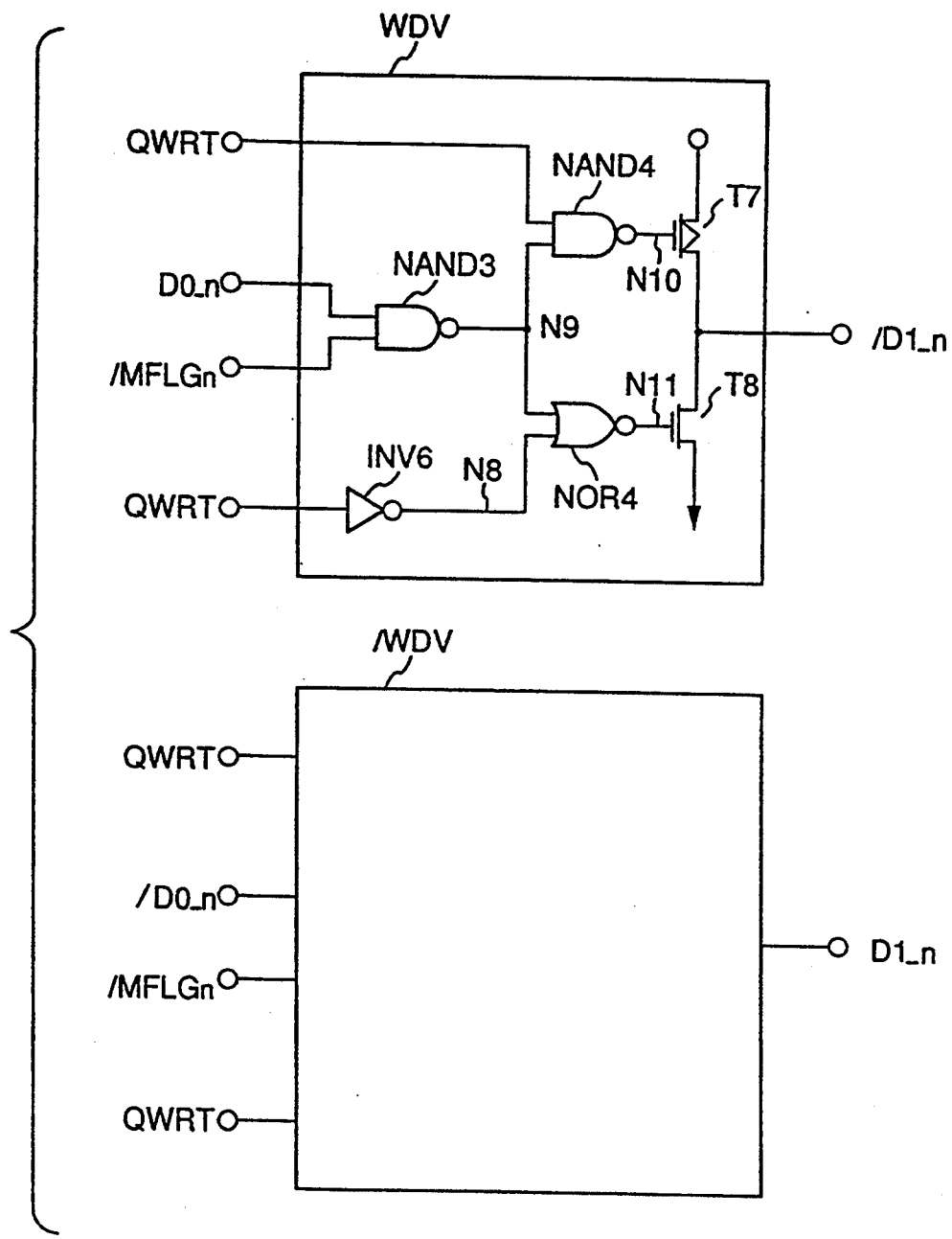
FIG. 13 is a circuit diagram showing a write driver of the second embodiment of the semiconductor memory device.

FIG. 11 shows a configuration of the control circuit WCTRL of the second embodiment. FIG. 12 shows a configuration of the write gate WGn, and FIG. 13 shows a configuration of the write driver WDVn.

As shown in FIG. 11, the control circuit WCTRL comprises circuits WCTRL1 and WCTRL2, and a delay circuit DLY4. The circuit WCTRL1 receives signals /RAS, /CAS and /WE. Upon the write cycle, all three signals change to low level. In response to these signals, the circuit WCTRL1 outputs a high level signal WRT. After having been delayed through the delay circuit DLY4, the same high level signal QIN is output and given to the input buffer DIBn.

Further, the high level signal WRT is inputted to the circuit WCTRL2. In the circuit WCTRL2, the signal WRT is delayed through the delay circuit DLY5 and then output as high level signal QWRT. Further, the signal QWRT is delayed through the delay circuit DLY6, inverted by an inverter INV4, and then output as a low level signal /WGT. The signal QWRT is given to the write drivers WDVn and the signal /WGT is given to the write gates WGn, respectively.

As shown in FIG. 12, the write gate WGn comprises NOR gates NOR3 and NOR3', inverters INV5 and INV5', P channel transistors T5 and T5', and N channel transistors T6 and T6'. This circuit configuration is the same as that of the write gate WGn of the first embodiment shown in FIG. 5, except that in the first embodiment, the control signal /WGTn inputted to the NOR gates NOR3 and NOR3' is different for each. In the second embodiment, the common control signal /WGT is inputted thereto for all the bits.

Further, in this second embodiment, the data D1n and /D1n inputted to the NOR gates NOR3 and NOR3', respectively, are both at high level, in the case of the masked bits in the write per bit mode. In this case, nodes N6 and N6' of the output terminals of the NOR gates NOR3 and NOR3' are both at low level. Therefore, the N channel transistors T6 and T6' whose gates are connected to the low level at the nodes N6 and N6' are both turned off. Further, nodes N7 and N7' of the output terminals of the inverters INV5 and INV5' are both at high level. Therefore, the P channel transistors T5 and T5' whose gates are connected to the high level at the nodes N7 and N7' are both turned off. Therefore, the write gate WGn is in the high impedance state without writing a data. Further, in the case where the data D1n and /D1n are of the ordinary polarity that is, the polarity is different from each other, the write gate operates in the same way as with the case of the first embodiment write gate WGn.

The configuration of the write driver WDVn is shown in FIG. 13. Data D0n and /D0n output from the input buffer DIBn, respectively, are input to the circuits WDV and /WDV, respectively. In addition, the signal QWRT and the signal /MFLGn are input in common to the circuits WDV and /WDV.

The control signal QWRT is input to a NAND gate NAND4. This signal is at low level before the write cycle. In response to this low level signal, the NAND gate NAND4 outputs a high level signal. In response to this high level signal, a P channel transistor T7 whose gate is connected to the high level signal at a node N10 is turned off. Further, the low level signal QWRT is inverted by an inverter INV6 and then input to a NOR gate NOR4, so that the NOR gate NOR4 outputs a low level signal. In response to this low level signal, the N channel transistor T8 whose gate is connected to the low level at a node N11 is turned off. As a result, the write driver WDV is deactivated.

Upon the write cycle, the control signal QWRT rises to high level. In the non-masked bits, the control signal /MFLGn is at high level, so that the NAND gate NAND3 operates as an inverter. The high level signal QWRT and the potential at a node N9 (the polarity of the data D0n is inverted) are input to the NAND gate NAND4, so that the NAND gate NAND4 outputs a potential opposite to that at the node N9 through the output terminal at a node N10. Further, the potential at the node N9 and a low level potential (the signal QWRT is inverted by the inverter INV6) are input to the NOR gate NOR4, so that the NOR gate NOR4 outputs a potential opposite to that at the node N9 through the output terminal at a node N11. As a result, the potentials at the nodes N10 and N11 are the same in polarity as that of the data D0n. These potentials are both input to gates of a P channel transistor T7 and an N channel transistor T8, respectively. Therefore, when the data D0n is at high level, only the N channel transistor T8 is turned on, and when at low level, only the P channel transistor T7 is turned on, so that the data /D1n (the data D0n is inverted in potential) is output.

On the other hand, the circuit /WDV outputs data D1n (the input data /D0n is inverted in potential).

The operation of the masked bit will be described hereinbelow. In the masked bit, the input signal /MFLGn is at low level. Therefore, in response to this signal /MFLGn, the output terminal at a node N9 of the NAND gate NAND3 is always at high level, irrespective of the polarity of the data D0n. The potential at the node N9 and the high level signal QWRT are input to the NAND gate NAND4, so that the NAND gate NAND4 gives a low level output to the gate of the P channel transistor T7 to turn on the P channel transistor T7. In response to the high level potential at the node N9 and the low level output from the inverter INV6, the NOR gate NOR4 outputs low level. In response to this low level output applied to the gate, the N channel transistor T8 is turned off. Therefore, the high level data /D1n is output. On the other hand, the circuit WDV outputs high level data D1n, irrespective of the level of the input data /D0n.

As described above, in the case of the masked bit, the high level data D1n and /D1n are output from the write driver WDVn, irrespective of the polarity of the data D0n and /D0n.

In the control circuit WCTRL of the second embodiment, the write driver WDVn and the write gate WGn operate as described above. Next, the operation in the write per bit mode of the second embodiment will be described with reference to FIGS. 14 and 15.

In the same way as with the case of the first embodiment, at the time point when the control signal /RAS falls from high to low level, if the control signal /WE is at low level, the operation enters the write per bit mode. At the same time, the mask information is received and the polarity of the control signal /MFLGn is determined for each bit in quite the same way as in the first embodiment.

Thereafter, the control signals /CAS and /WE both change to low level. Upon the start of the writing operation, the signal QIN first changes to high level to activate the input buffers DIBn. Therefore, all the data at the input terminals I1 to I4 are received, and the input buffers output D01 and /D01, . . . D04 and /D04.

Then, when the control signal QWRT changes to high level, the write drivers WDVn are activated. At this time, since the control signals /MFLGn are input to the write drivers WDVn, the write drivers operate according to the polarity of the control signals /MFLGn as follows.

Figure 14:
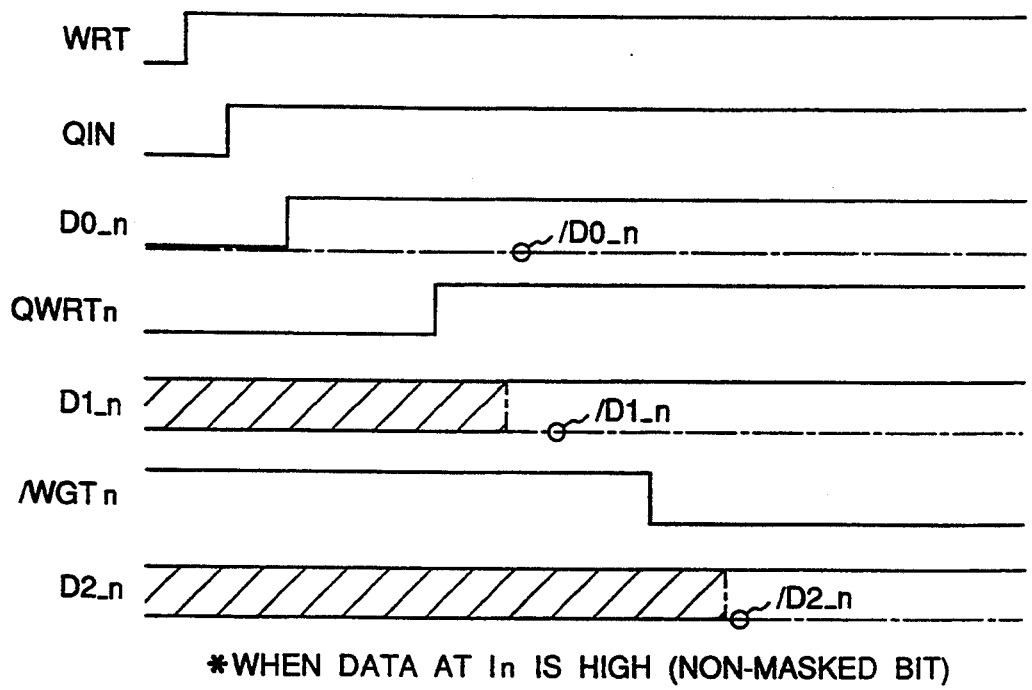
FIG. 14 is a timing diagram showing waveforms of the respective pairs of data lines and the control signals in a non-masked bit in the second embodiment of the semiconductor memory device.

In the bit (non-masked bit) at which the control signal /MFLGn is at high level, a pair of the first data lines D1n and /D1n are driven to the same polarity as that of the outputs D0n and /D0n of the input buffer DIBn (cf. FIG. 14).

Figure 15:
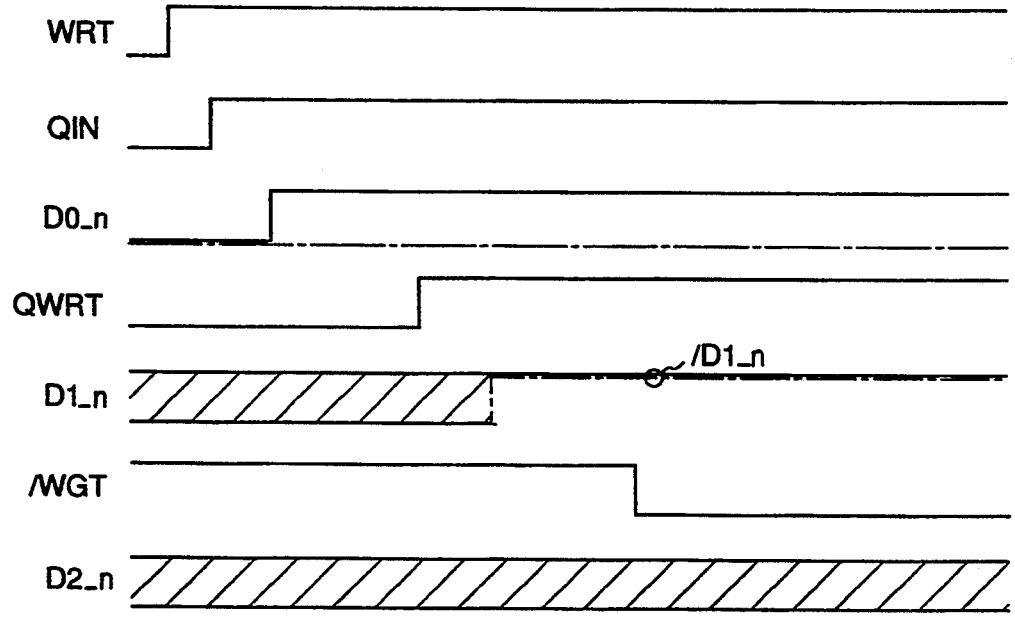
FIG. 15 is a timing diagram showing waveforms of the respective pairs of data lines and the control signals in a masked bit in the second embodiment of the semiconductor memory device.

In the bit (masked-bit) at which the control signal /MFLGn is at low level, a pair of the first data lines D1n and /D1n are both driven to the fixed state (this fixed state means both lines which constitute the first data line at the high level), irrespective of the outputs D0n and /D0n of the input buffer DIBn (cf. FIG. 15).

Successively, when the control signal /WGT changes to low level, since the write gate WGn is open at the non-masked bit, the data on the first data lines is transmitted to the second data lines (cf. FIG. 14). In the masked bit, however, since the first data lines D1n and /D1n are both at the high level, the write gate WGn becomes at the high impedance, state without transmitting the data to the second data lines D2n and /D2n, so that the data at the input terminal In does not reach the memory cell.

As described above, in the second embodiment, the control signal /WGT of the write gate is common in bits. However, when the first data lines change to the fixed state, since the write gate WGn becomes at the high impedance, state it is possible to write data bit by bit. Accordingly, even if the number of bits increases, it is unnecessary to provide a control signal for each bit, that is, only a single control signal is used at the minimum. Therefore, it is possible to reduce the area required for wiring the control signals.

The first and second embodiments have been described only by way of examples, and the present invention is not limited to these embodiments. For instance, in the case of the second embodiment, the write drivers WDVn fix a pair of the first data lines at high level in the masked bits. Without being limited to only the high level, for example, it is possible to fix a pair of the first data lines at low level, as long as the state in the masked bits is different from the state for transferring data. Further, the number of first or second data lines is not limited to only a pair (two). It possible to change the number of these data lines to one or three or more. In the case where the number of the first data line is one, a level higher or lower than the electric potential of the data is determined as a fixed state. Further, in the second embodiment, the control signal /WGT for controlling the write gates WGn is common for all bits. However, it is of course unnecessary to use the control signal in common for all bits.

What is claimed is:

1. A semiconductor memory device having a plurality of bits comprising:
   an input buffer for receiving an external data and providing a first output signal;
   a first and second data line;
   a first write circuit for inputting a first control signal, an operation signal and the first output signal from the input buffer, the first write circuit outputting a second output signal on the first data line; and
   a second write circuit for inputting a second control signal and the second output signal from the first data line, the second write circuit outputting a third output signal on the second data line, the operation signal being a non-common signal for all bits, and the second control signal being a common signal for at least two bits; wherein during a data writing operation and for bits where the operation signal is in an non-enable state, the first write circuit transfers data from the input buffer to the first data line when the first control signal becomes enabled, and the second write circuit transfers data from the first data line to the second data line when the second control signal becomes enabled; and for bits where the operation signal is in an enabling state, the first write circuit sets the first data line to a fixed data state independent of data outputted from the input buffer when the first control signal becomes enabled, and in response to the fixed state of the first data line, the second write circuit goes into a predetermined output state.

2. The semiconductor memory device of claim 1, wherein the first and second data lines each comprises two data lines, respectively, data are transmitted through the two data lines complementarily, and the first and second data lines are used for data reading and writing operations.

3. The semiconductor memory device of claim 2, wherein a polarity of the operation signal is determined from data received by the input buffer during the writing operation.

4. The semiconductor memory device of claim 1, wherein the operation signal is an irregular operation signal.

5. The semiconductor memory device of claim 2, wherein the two data lines of the first data line are at the same polarity and potential level during the fixed state of the first data line and the second write circuit sets the second data line to a high impedance state in response to the fixed state of the first data line.

* * * * *